United States Patent [19]

Tachi et al.

[11] Patent Number: 4,857,137
[45] Date of Patent: Aug. 15, 1989

[54] PROCESS FOR SURFACE TREATMENT

[75] Inventors: Shinichi Tachi, Sayama; Sadayuki Okudaira, Ome; Kazunori Tsujimoto; Kiichiro Mukai, both of Hachioji, all of Japan

[73] Assignee: Hitachi, Ltd., Tokyo, Japan

[21] Appl. No.: 9,784

[22] Filed: Feb. 2, 1987

[30] Foreign Application Priority Data

| Jan. 31, 1986 [JP] | Japan | 61-18017 |
| May 6, 1986 [JP] | Japan | 61-102028 |
| Jun. 11, 1986 [JP] | Japan | 61-133651 |

[51] Int. Cl.$^4$ ........................ H01L 21/306
[52] U.S. Cl. ................... 156/640; 156/643; 156/646; 204/298; 427/35
[58] Field of Search ............... 156/643, 646, 640; 204/298; 427/35, 42, 43.1

[56] References Cited

U.S. PATENT DOCUMENTS

| 4,343,829 | 8/1982 | Tochikubo et al. | 427/35 |
| 4,540,446 | 9/1985 | Nishizawa | 156/643 |
| 4,662,977 | 5/1987 | Motley et al. | 156/345 |

FOREIGN PATENT DOCUMENTS

| 0157214 | 9/1982 | Japan | 156/643 |
| 0111321 | 7/1983 | Japan | 156/643 |
| 0044828 | 3/1984 | Japan | 156/643 |

OTHER PUBLICATIONS

Boyd et al., "Directional Reactive Ion Etching at Oblique Angles" Appl. Phys. Lett. 36(7), Apr. 1, 1980.

Primary Examiner—David L. Lacey
Assistant Examiner—L. Johnson
Attorney, Agent, or Firm—Antonelli, Terry & Wands

[57] ABSTRACT

An ion beam is allowed to hit the surface of a target and the resulting forward scattered particle beam is then allowed to hit the surface of a workpiece, thereby etching or modifying the surface of the workpiece or depositing a film on the surface of the workpiece. By bombardment of ions with the target, electric charges possessed by the ion beam are lost, and only the thus neutralized forward scattered particle beam is allowed to hit the surface of the workpiece, and thus the said surface treatment can be carried out without any electrically charging trouble.

17 Claims, 5 Drawing Sheets

4,857,137

PROCESS FOR SURFACE TREATMENT

BACKGROUND OF THE INVENTION

This invention relates to a process for surface treatment including various treatments such as etching, modification, cleaning, or impurity doping of the surface of semiconductor, metal or insulating material (which will be hereinafter referred to generally as "workpiece") or deposition of a film on the surface, and more particularly to a process for surface treatment suitable for precise etching or modification of the surface of a semiconductor material or film deposition thereon.

Heretofore, a gas plasma or ion beam has been used in the etching treatment in the production of semiconductor devices. That is, the etching treatment has been carried out by allowing ions or electrons from a plasma, when the plasma is used, to hit the surface of a workpiece, or ions, when an ion beam is used, to hit the surface of a workpiece. Phenomena that these electrically charged particles hit the surface of a workpiece and also the problems encountered in the production of semiconductor devices are discussed in Dry Process Symposium Proceeding (1985) V5, 132P. That is, the etching treatment carried out by allowing the electrically charged particles to hit the surface of the workpiece has such a problem that the surface of the workpiece is electrically charged, and the resulting insulating film is deteriorated. It has been found that the problem occurs not only in case of the etching treatment, but also in case of the surface treatments using the electrically charged particles, such as cleaning or impurity doping of the surface, or modification of the surface or deposition of a film on the surface.

With recent demands such as a considerably higher integration density for the semiconductor devices and much smaller dimensions for the transistors, etc., the influence of the electrical charging of the surface of a workpiece by the electrically charged particles cannot be disregarded, and it is indispensable to prevent the influence of electrical charging by the electrically charged particles to make the dimensions of various semiconductor devices much smaller.

SUMMARY OF THE INVENTION

An object of the present invention is to solve the problem encountered in the prior art, that is, such a problem that the surface of a workpiece is electrically charged when the electrically charged particles are allowed to hit the surface of a workpiece, and the surface of the workpiece is damaged, for example, deterioration of an insulating film, etc. and to provide a process for surface treatment, capable of carrying out the various treatments while preventing the surface of a workpiece from breakage, deterioration, etc. by the electrical charging.

The object of the present invention can be attained by irradiating a target with a ion beam in a reactor vessel, and allowing the forward scattered particle beam thus formed to hit the surface of a workpiece, whereby various treatments such as etching or modification of the surface of the workpiece or deposition of a material on the surface of the workpiece can be carried out.

PREFERRED EMBODIMENTS OF THE INVENTION

Figure 1:
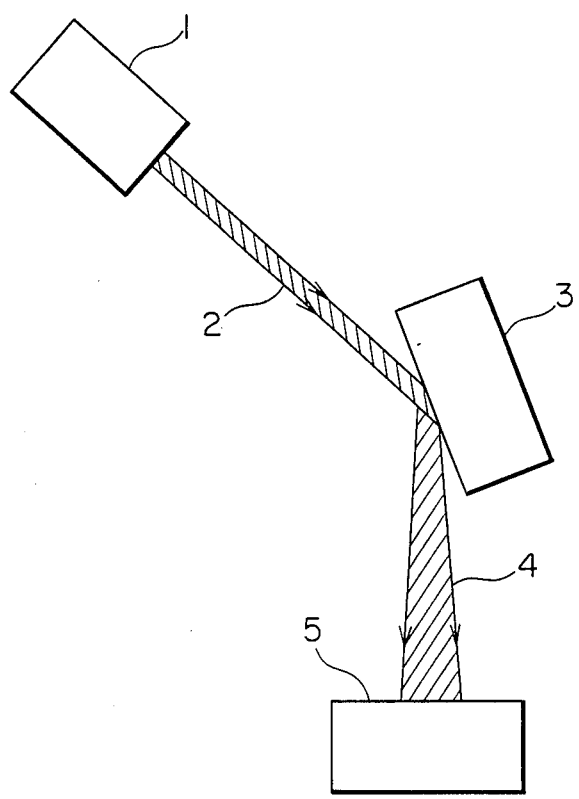
FIGS. 1 and 2 are schematic views illustrating the structure of the present invention.

When an ion beam hits the surface of a target and is scattered, the electrical charge possessed by most of the ion particles is neutralized to give neutralized particles. Thus, exchange of electrical charges occurs less on the surface of the workpiece when the forward scattered particle beam hits the surface of a workpiece, and the surface treatment can be carried out while preventing the breakage or damage of the workpiece due to the electrical charging phenomenon.

The present invention will be outlined below, referring to FIG. 1.

An ion beam 2 extracted from an ion source 1 is allowed to hit a target 3 for scattering. The forward scattered particle beam 4 thus formed is composed mostly of neutralized particles converted from the incident ions by losing their electrical charges, and is allowed to hit the surface of a workpiece 5, though being slightly lost by emanation therefrom. The surface of the workpiece 5 can be treated through the hitting of the neutralized particles. Since most of the forward scattered particle beam 4 is composed of neutralized particles, the electrical charging phenomenon occurs much less on the surface of the workpiece, and thus such semiconductor materials as silicon (Si), germanium (Ge), gallium-arsenic (GaAs), gallium-phosphorus (GaP), indium-phosphorus (InP) and their mixture; such insulating materials as silicon dioxide ($SiO_2$), trisilicon tetranitride ($Si_3N_4$), tantalum oxide ($Ta_2O_5$), silicon oxynitride (SiON), aluminum oxide ($Al_2O_3$), boron nitride (BN), etc.; such metals as aluminum (Al), copper (Cn), nickel (Ni), titanium nitride (TiN), tangsten (W), molybdenum (Mo), gold (Au), silver (Ag), etc. can be surface-treated as a workpiece.

The present invention is different from the sputtering deposition process for depositing a substance on the surface of a workpiece by utilizing the sputtering phenomenon. The sputtering deposition process is a process for physically sputtering atoms from a solid surface by allowing ions to hit the surface (sputtering phenomenon), whereby the atoms sputtered from the solid surface are deposited on the surface of a workpiece, whereas in the present invention the particles scattered on the target 3 are allowed to hit the surface of the workpiece 5 to conduct the surface treatment of the workpiece 5, and the atoms of the target 3 are never deposited on the surface of the workpiece 5.

Figure 2:
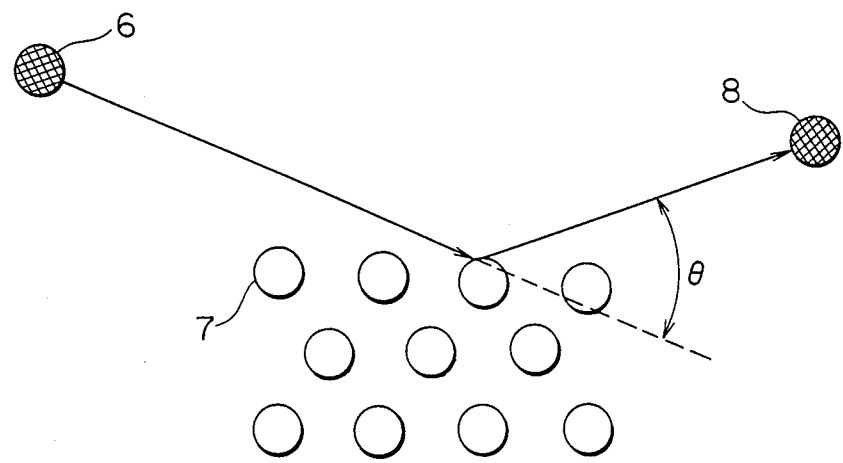

The principle of scattering will be described below, referring to FIG. 2.

Incident ions 6 having a mass of Mo and an energy of Eo are allowed to hit the surface of a solid target in an inclined direction and collide with atoms 7 having a mass of $M_1$ on the surface of the solid, target, whereby the hitting ions 6 are scattered at a scattering angle of 8 and will have an energy of $E_2$. The thus scattered particles 8 can have the energy $E_2$ given by the following equation:

$$E_1 = E_0 \left( \frac{\cos\theta + (A^2 - \sin^2\theta)^{\frac{1}{2}}}{1 + A} \right)^2$$

where $A = M_1/M_0$.

When the scattering angle $\phi$ and the energy $E_0$ and the mass $M_0$ of the hitting ions 6 are determined, the energy $E_1$ of the scattered particles 8 can be very precisely controlled according to the foregoing equation by selecting the mass of the atoms 7 on the surface of solid target. The scattered particles are the same element species as that of the hitting ions, but are converted mostly to neutralized particles by losing their electrical charges.

The scattering efficiency strongly depends on the energy of the hitting ions, and a very good scattering efficiency can be obtained when the energy of the hitting ions is in a range of 1 to 10 KeV. However, in case that the energy of the hitting beam is below 1 keV, such a scattering can be obtained as to generate the neutralized particles of low energy, whereas in case that the hitting beam has a higher energy than 10 KeV, such a scattering can be obtained as to generate the neutralized particles of high energy.

In case of depositing a film on the surface of a workpiece of the said semiconductor material, insulating material or metal, a very good result can be obtained when the hitting ions contain at least one ion species of the same element species as those of the workpiece.

In case of etching a workpiece, ions of inert elements such as helium (He), neon (Ne), argon (Ar), krypton (Kr), xenon (Xe), etc., for example, $He^+$, $Ne^+$, $Ar^+$, $Kr^+$, $Xe^+$, etc.; ions of halogen elements such as fluorine (F), chlorine (Cl), bromine (Br), etc., for example, $F^+$, $Cl^+$, $Br^+$, etc.; furthermore diatomic or polyatomic ions containing at least one halogen species such as $CCl_n^+$, $CF_n^+$ $CBr^+$, $BCl_n^+$ and $SF_m^+$ ($n=1-3$ and $m=1-6$), or their polyvalent ions can be used.

In case of modifying the surface of a workpiece, ions containing at least one element ions species necessary for modifying the surface of a workpiece, for example, $N^+$, $N_2^+$, $O^+$, $O_2^+$, $C^+$, $CH_n^+$ ($n=1-3$), $CO^+$, $CO_2^+$, $Si^+$, etc. can be used.

The target for use in the present invention includes, for example, various metals such as W, Mo, Ti, Fe, Ni, Al, Cu, Cr, etc.; various alloys of said metals such as Fe-Ni alloy, stainless steel, etc.; semiconductors such as Si, Ge, etc., and can be appropriately selected in view of the kind of a workpiece and the desired purpose of surface treatment.

The hitting beam for use in the etching according to the present invention can be appropriately selected in view of the kind of workpiece, and many kinds of the hitting beams are available. That is, the workpiece can be etched through a chemical reaction between the forward scattered particle beam that hits the surface of a workpiece and the atoms on the surface of the workpiece, where such a combination of the workpiece with the forward scattered particle beam as to produce a chemical reaction product having a higher vapor pressure is preferable. In case of depositing a film, the film can be deposited on any workpiece, so long as the hitting ion beam contains at least one of the same element ion species as those of the film component elements.

EXAMPLE 1

Figure 3:
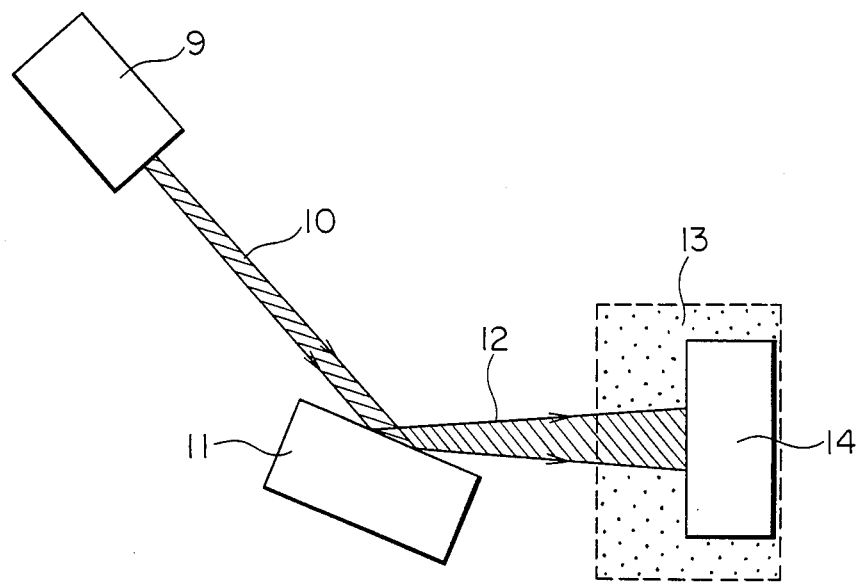
FIGS. 3 to 6 are schematic views illustrating various embodiments of the present invention.

FIG. 3 shows one embodiment of the present invention, where a workpiece is surface-treated in a gas atmosphere.

An ion beam 10 extracted from an ion source 9 is allowed to hit the surface of a target 11, and the forward scattered particle beam 12 is then allowed to hit the surface of a workpiece 14 through a gas atmosphere 14. According to the present embodiment, etching, surface modification or film deposition can be carried out by various combinations of the materials for the ion beam 10, the gas 13 and the workpiece 14. As the hitting ions 10, not only inert ions such as $He^+$, $Ne^+$, $Ar^+$, $Kr^+$, $Xe^+$, etc., but also very many ion species that can be generated in the ion source 9 can be used, and a broader range of the combinations than those according to the embodiment shown in FIG. 1 is possible. A combination of the gas 13 with the workpiece 14 in the etching must be selected so that a compound formed from the component element of the workpiece and at least one element of the atmosphere gas can have a higher vapor pressure. When the workpiece 14 is composed of Si, a gas containing at least one of halogen elements such as F, Cl, Br and I must be introduced into the reactor vessel. In case that the workpiece 14 is composed of Al, a gas containing Cl must be used as an atmosphere gas. In case of a workpiece composed of C, a gas containing at least one of O, N, F, Cl, Br, etc. must be used. In case of modifying the surface of a workpiece, a gas must be selected so that a compound formed from the element of the workpiece and at least one of elements in the gas molecule or atom can have a lower vapor pressure. In case of depositing a film, a gas containing at least one of the film component elements must be used.

According to the embodiment shown in FIG. 3, etching, surface modification or film deposition can be attained with much higher efficiency than that according to the embodiment shown in FIG. 1, where no gas is used at all.

EXAMPLE 2

Figure 4:
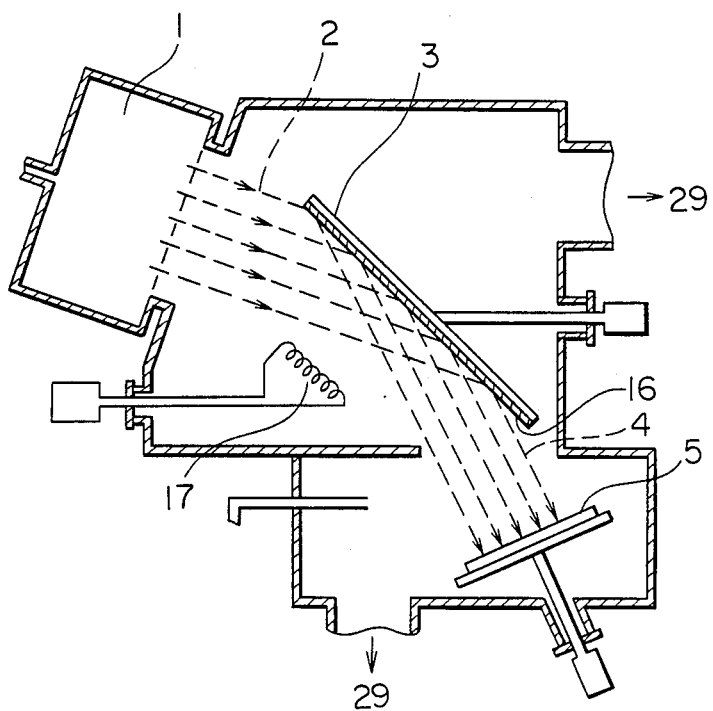

Another embodiment of the present invention will be described below, referring to FIG. 4.

An ion beam 2 extracted from an ion source 1 is allowed to hit the surface of a target 3, and the forward scattered particle beam 4 from the surface of the target 3 is then allowed to hit the surface of a workpiece 5 to conduct the surface treatment, as in Example 1. However, the present embodiment is characterized by providing a polytetrafluoroethylene film 16 on the surface of the target 3 composed of Si. If necessary, an electron-emitting neutralizer 17 may be provided, as shown in FIG. 4. The ion species of the ion beam may be either an inert gas or an active gas, and must be selected in view of a higher ionization efficiency.

Most of the ion beam 2 that hits the polytetrafluoroethylene film 16 provided on the surface of the target 3 is scattered on the resin film 16, whereby the atoms and molecules that constitute the resin film 16 are sputtered and tend to travel toward the surface of the workpiece 5. By controlling the scattering and sputtering angle, the angle at which the forward scattered particle beam 4 and the sputtered atoms or molecules hit the surface of the workpiece 5 can be made as perpendicular as possible to the surface of the workpiece 5. When the resin film 16 has a smaller thickness than 50 $\mu$m, the charge-up by ion bombardment can be kept low, whereas, if the thickness is 50 μm or more, particularly when such a thick resin film is provided on the target 3 by a mechanical means, the charge-up is liable to occur. In the latter case, electrons are made to emit from the neutralizer 17 to hit the resin film 16, whereby the charge-up can be prevented.

Among the particles that hit the surface of the workpiece 5 substantially perpendicularly thereto, the halogen atoms and the halogen compound particles undergo chemical reactions with materials constituting the workpiece 5 such as Si and Si compounds, and metal elements such as Al, W, Mo, Ga, As, etc., and the reaction products evaporate from the surface of the workpiece 5 and are vented to the outside through a vent outlet 29.

As the resin film 16, not only the polytetrafluoroethylene, but also various fluorocarbon resin and chlorocarbon resin such as polychlorotrifluoroethylene, tetrafluoroethylene-hexafluoropropylene copolymer, polyvinyl fluoride, etc. can be used.

The fluorine or chlorine-containing resin film 16 provided on the surface of the target 3 can generate much fluorine or chlorine particles when hit by the incident ion beam 2. The thus generated chlorine or fluorine particles reach the surface of the workpiece 5 to occasion chemical reactions with the component elements on the surface of the workpiece 5. The forward scattered particle beam 4 that hits the surface of the workpiece 5 contains less ionic components, and surface etching or other surface treatment can be carried out without any sputtering.

EXAMPLE 3

Figure 5:
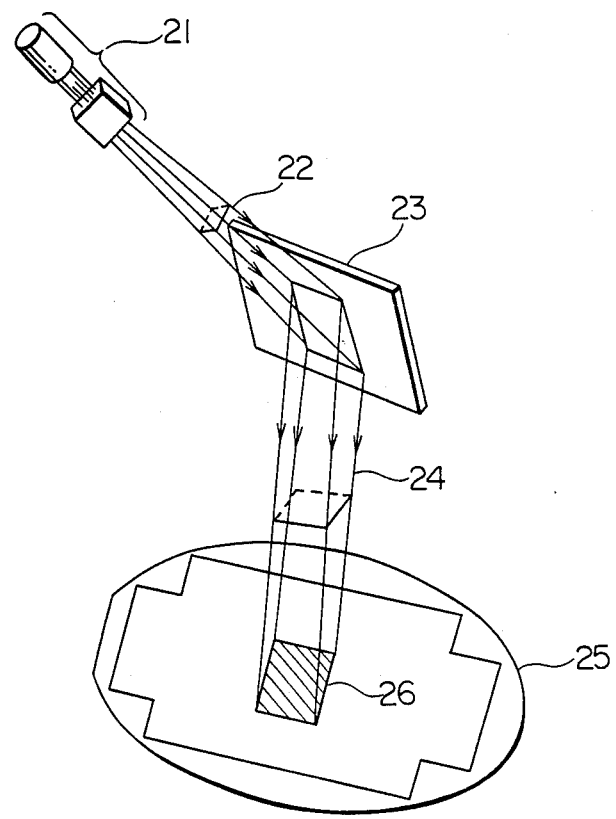

Other embodiment of the present invention will be described below, referring to FIG. 5.

An ion beam 22 extracted from an ion source (not shown in the drawing) is shaped into a desired form through a beam transport system 21 comprising a lens, a deflecting plate and a slit and the thus shaped ion beam 22 is allowed to hit a target 23 composed of Si. The resulting forward scattered particle beam 24 selectively hits a region 26 to be surface-treated on an workpiece 24.

According to the present embodiment, the ion beam 22 is shaped through the ion transport system 21. The path of the ion beam 22 can be changed by the defecting plate in the ion transport system 21, and thus any desired region 26 on the workpiece 25 can be selectively hit by the forward scattered particle beam. That is, the selective surface treatment of the desired region can be properly carried out.

The present embodiment is particularly effective, when applied to promotion of reactions between an atmosphere gas and the surface of the workpiece 25 by the forward scattered particle beam 24 that hits the workpiece 25 in a gas atmosphere. The surface treatment can be carried out only in the region 26 hit by the forward scattered particle beam 24, while other regions undergo no surface treatment at all.

By moving or rotating the target 23, the position of the forward scattered particle beam that hit the surface of the workpiece 25, that is, the region 26 to be surface-treated, can be changed in the same manner as in the said case of electrical deflection using the deflecting plate. Furthermore, the surface treatment can be carried out by making the forward scattered particle beam 24 onto the workpiece 25 finer or scanning the beam 24 in the region 26 to be surface-treated.

EXAMPLE 4

Figure 6:
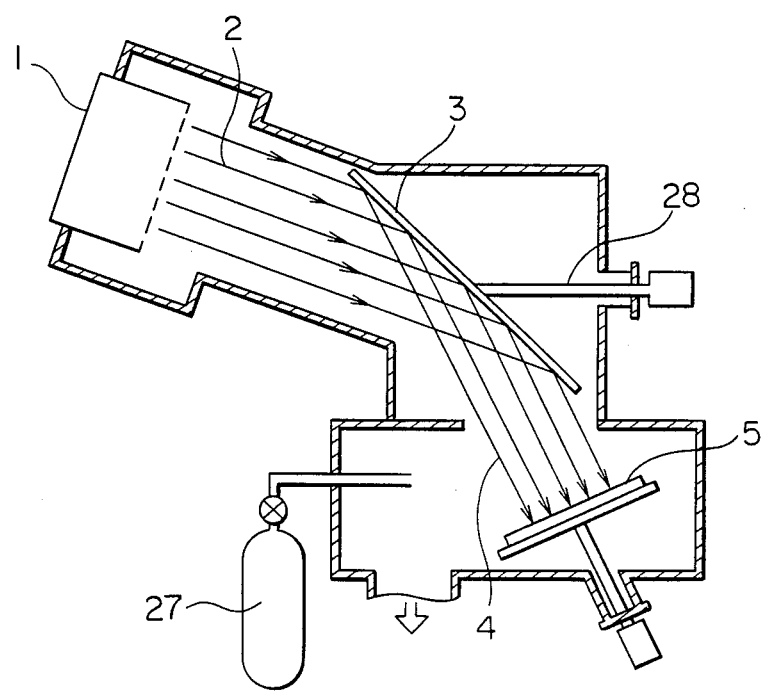

Further embodiment of the present invention will be described below, referring to FIG. 6.

An ion beam 2 extracted from an ion source 1 is allowed to hit a target 3, and particles scattered on the surface of the target 3 are then allowed to hit the surface of a workpiece 5 to effect the surface treatment.

The present embodiment is characterized by providing a cooler 28 for cooling the target 3. A gas 27 introduced into the reactor vessel is adsorbed onto the surface of cooled target 3, and most of the ion beam that hits the target 3 is scattered on the gas-adsorbed layer. A portion of the incident ions 2 sputters the adsorbed gas components and takes them together from the surface. Thus, the forward scattered particle beam 4 and the sputtered atoms can hit the surface of the workpiece 5, when the surface of the target is cooled, irrespective of the species of atoms on the bare surface of the target 3, and it can be prevented thereby that the atoms of the target as sputtered without the cooling hit the surface of the workpiece 5 and act as a contamination source or impurities.

The temperature of the target 3 can be set in view of the species of a gas to be introduced. When it is set below the liquefaction temperature of a gas and above the solidification temperature of the gas, a phenomenon that the incident ions are scattered on the liquid surface and another phenomenon that the liquid surface atoms are sputtered occur at the same time, and a proportion of the particles scattered on the surface of the target and the sputtered particles therefrom is larger than that obtained when scattered on the bare surface of the target. Above the gas liquefaction temperature, the adsorption of the gas onto the surface of the target is not sufficient, and the atoms of the target are also sputtered and mixed into the sputtered particles of the gas. However, the mixing can be reduced by increasing the number of gas particles that hit the surface of the target as compared with the density of the incident ion particles.

When the temperature of the target 3 is set below the solidification temperature of a gas, the gas adsorbed on the surface of the target is solidified. A proportion of the number of scattered beam particles and the number of sputtered particles is larger than that obtained in the said two temperature ranges, and the surface treatment can be carried out with a stronger scattered particle beam and sputtered particles from the solidified gas. That is, the surface treatment can be carried out more effectively.

When a substance capable of taking a liquid state under the atmospheric pressure even above room temperature (20° C.) is introduced into a vacuum vessel a phenomenon that the atoms of the target is sputtered and mixed into the scattered particle beam can be suppressed by setting the temperature of the target below the liquefaction temperature of the substance. Thus, the mixing of the sputtered particles can be reduced and the surface treatment can be carried out more effectively by setting the temperature of a target below the liquefaction temperature of a substance to be introduced in a vacuum vessel.

In case of introducing a gas mixture of at least two species into a reactor vessel, the same effect as obtained at the solidification temperature of the said single gas species can be obtained by setting the temperature of a target below the lowest solidification temperature of all the gas species used. Even above the highest liquefaction temperature of all the gas species used, the same effect as obtained in case of the said single gas species can be obtained.

Between the highest liquefaction temperature and the lowest solidification temperature, it is effective to set the temperature of a target so that a gas containing a surface treatment-inhibiting element may not be adsorbed onto the surface and solidifed thereon.

In a surface treatment apparatus based on a differential pumping provided between a vacuum vessel containing a target and a reactor vessel containing a workpiece, it is possible to introduce different gases into the respective vessels, and it is effective for the surface treatment to cool the target in accordance with the said set temperatures.

EXAMPLE 5

A stainless steel target plate in a vacuum chamber was cooled to the liquefied nitrogen temperature ($-196°$ C.) and a $Cl_2$ gas was introduced into the vacuum vessel to form a $Cl_2$ deposition layer on the target plate. An $Ar^+$ ion beam (energy: 1 keV; current density: 0.1 mA/cm$^2$) was allowed to hit the surface of the target plate in an inclined direction, and forward scattered. A workpiece of silicon wafer was placed in a $Cl_2$ gas atmosphere, and the said forward scattered particle beam was allowed to hit the surface of the workpiece, whereby the workpiece was etched. It was found that the etching rate of Si was dependent upon the pressure of the $Cl_2$ gas as an atmosphere gas, and was 2,000 Å/min. When the pressure of the $Cl_2$ gas was $1\times10^{-3}$ Torr, and was increased with increasing gas pressure, and that when the gas pressure was too high, for example, more than 1 Torr, the forward scattered particle beam was scattered away into the atmosphere gas and failed to reach the surface of the workpiece, slowing down the etching. Contamination of the surface of the workpiece with the stainless steel components (Fe, Cr and Ni) could be considerably reduced when the chlorine deposition layer was formed on the surface of the target by cooling, as compared with that when no chlorine deposition layer was formed thereon.

EXAMPLE 6

This embodiment shows a case of film deposition by a forward scattered particle beam.

A GaAs substrate was used as a substrate on which to deposit a film, and a copper plate was used as a target. The target in a vacuum vessel was cooled to $-150°$ C., and a $SiH_4$ gas was introduced into the vacuum vessel to form a $SiH_4$ film on the surface of the copper plate. An $O_2^+$ ion beam (energy: 3 keV) was allowed to hit the $SiH_4$ film on the target in an inclined direction and forward scattered. The forward scattered particles were composed of O atoms and $O_2$ molecules and were allowed to hit the GaAs substrate in an $SiH_4$ atmosphere, whereby $SiO_2$ was deposited on the surface of the GaAs substrate. It was found that the deposition rate was strongly dependent upon the ion current density of the $O_2^+$ ion beam and the scattering angle (an angle of the incident ion beam to the normal to the Cu target), and, when the current density of the ion beam was 0.15 mA/cm$^2$ and the scattering angle was 50°, the $SiO_2$ deposition rate was 50 Å/min. When an $O_2$ gas was mixed into the $SiH_4$ atmosphere gas, the $SiO_2$ deposition rate was increased to about 5 times as large, i.e. 240 Å/min. The thus obtained $SiO_2$ film was not contaminated with copper. It was found that the present embodiment was suitable also for the deposition of a thin insulating film.

What is claimed is:

1. A process for surface treatment, which comprises striking the surface of a solid target with an ion beam comprising at least one element species to thereby forward scattering particles and produce a forward scattered particle beam comprising said at least one element species, and then directing the forward scattered particle beam toward the surface of a workpiece, striking the workpiece surface to etch or modify the surface of the workpiece or deposit a film on the surface of the workpiece.

2. A process according to claim 1, wherein the ion beam has an ion energy of 1 to 10 kev.

3. A process according to claim 1, wherein the ions in the ion beam are at least one member selected from the group consisting of $He^+$, $Ne^+$, $Ar^+$, $Kr^+$, $Xe^+$, $F^+$, $Cl^+$, $Br^+$, $CCl_n^+$, $CF_n^+$, $CBr_n^+$, $BCl_n^+$, and $SF_m^+$, where $n=1-3$ and $m=1-6$; $N_2^+$, $O^+$, $O_2^+$, $C^+$ and $CH_n^+$ where $n=1-3$; and $CO^+$, $CO_2^+$ and $Si^+$.

4. A process according to claim 1, wherein an organic thin film containing a halogen atom is formed on the surface of the target.

5. A process according to claim 4, wherein the organic thin film is composed of polytetrafluoroethylene, polychlorotrifluoroethylene, tetrafluoroethylene-hexafluoropropylene copolymer or polyvinyl fluoride.

6. A process according to claim 1, wherein the ion beam strikes a cooled target.

7. A process according to claim 1, wherein the forward scattered particle beam strikes a predetermined region on the workpiece.

8. A process according to claim 1, wherein said workpiece is composed of a predetermined element species and said ion beam contains said predetermined element species and wherein said scattered particle beam strikes said surface of said workpiece to thereby deposit a film on the surface of the workpiece.

9. A process according to claim 1, wherein said workpiece is in a predetermined gas atmosphere.

10. A process according to claim 1, wherein the target is a semi-conductor.

11. A process according to claim 10, wherein the target is a semiconductor composed of Si or Ge.

12. A process according to claim 1, wherein said target is metal or an alloy of a metal.

13. A process according to claim 12, wherein the target is a metal selected from the group consisting of W, Mo, Ti, Fe, Ni, Al, Cu and Cr.

14. A process according to claim 12, wherein the target is an alloy of a metal selected from the group consisting of W, Mo, Ti, Fe, Ni, Al, Cu, and Cr.

15. A process according to claim 1, wherein said ion beam comprises electrically charged particles of said at least one element species and said forward scattered particles beam comprises neutralized particles of said at least one element species.

16. A process according to claim 15, wherein said forward scattered particle beam consists essentially of neutralized particles of said at least one element species.

17. A process according to claim 15, wherein said ion beam strikes said surface of said target at a predetermined inclined angle with respect to said target with atoms on said surface of said target, whereby said electrically charged particles of said at least one element species are neutralized and said neutralized particles of said at least one element species are scattered at a particular scattering angle toward said surface of said workpiece.

* * * * *